(12) United States Patent
Sokolov et al.

(10) Patent No.: US 8,879,294 B2
(45) Date of Patent: Nov. 4, 2014

(54) SELECTIVE ACTIVATION OF PROGRAMMING SCHEMES IN ANALOG MEMORY CELL ARRAYS

(75) Inventors: Dotan Sokolov, Ra'anana (IL); Naftali Sommer, Rishon Le-Zion (IL); Uri Perlmutter, Ra'anana (IL); Ofir Shalvi, Ra'anana (IL)

(73) Assignee: Apple Inc., Cupertino, CA (US)

( * ) Notice: Subject to any disclaimer, the term of this patent is extended or adjusted under 35 U.S.C. 154(b) by 233 days.

(21) Appl. No.: 13/532,700

(22) Filed: Jun. 25, 2012

(65) Prior Publication Data

US 2012/0262970 A1    Oct. 18, 2012

Related U.S. Application Data

(62) Division of application No. 12/714,501, filed on Feb. 28, 2010, now Pat. No. 8,228,701.

(60) Provisional application No. 61/156,520, filed on Mar. 1, 2009.

(51) Int. Cl.
| G11C 27/00 | (2006.01) |
| G11C 11/56 | (2006.01) |
| G11C 7/02  | (2006.01) |
| G11C 16/34 | (2006.01) |

(52) U.S. Cl.
CPC .......... *G11C 27/005* (2013.01); *G11C 11/5628* (2013.01); *G11C 16/3418* (2013.01); *G11C 7/02* (2013.01)
USPC ...................................... 365/45; 365/185.03

(58) Field of Classification Search
USPC .................... 365/45, 185.03, 185.24
See application file for complete search history.

(56) References Cited

U.S. PATENT DOCUMENTS 8,169,825 B1 *   5/2012   Shalvi et al. ............. 365/185.09

* cited by examiner

*Primary Examiner* — Vu Le
(74) *Attorney, Agent, or Firm* — Meyertons, Hood, Kivlin, Kowert & Goetzel P.C.

(57) ABSTRACT

A method for data storage includes defining a first programming scheme that programs a group of analog memory cells while reducing interference caused by at least one memory cell that neighbors the group, and a second programming scheme that programs the group of the analog memory cells and does not reduce all of the interference reduced by the first programming scheme. One of the first and second programming schemes is selected based on a criterion defined with respect to the analog memory cells. Data is stored in the group of the analog memory cells using the selected programming scheme.

31 Claims, 2 Drawing Sheets

SELECTIVE ACTIVATION OF PROGRAMMING SCHEMES IN ANALOG MEMORY CELL ARRAYS

CROSS-REFERENCE TO RELATED APPLICATIONS

This application is a division of U.S. patent application Ser. No. 12/714,501, filed Feb. 28, 2010, which claims the benefit of U.S. Provisional Patent Application 61/156,520, filed Mar. 1, 2009. The disclosures of all these related applications are incorporated herein by reference.

FIELD OF THE INVENTION

The present invention relates generally to memory devices, and particularly to methods and systems for programming analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

SUMMARY OF THE INVENTION

An embodiment of the present invention provides a method for data storage, including:

defining a first programming scheme that programs a group of analog memory cells while reducing interference caused by at least one memory cell that neighbors the group, and a second programming scheme that programs the group of the analog memory cells and does not reduce all of the interference reduced by the first programming scheme;

selecting one of the first and second programming schemes based on a criterion defined with respect to the analog memory cells; and storing data in the group of the analog memory cells using the selected programming scheme.

In some embodiments, upon selecting the first programming scheme, storing the data includes initially programming the group so as to store given data, programming the at least one memory cell that neighbors the group after initially programming the group, and re-programming the group with the given data after programming the at least one memory cell that neighbors the group. In an embodiment, upon selecting the second programming scheme, storing the data includes programming the group with the given data only once.

In a disclosed embodiment, upon selecting the first programming scheme, storing the data includes pre-compensating respective storage values for storage in the memory cells in the group responsively to the at least one memory cell that neighbors the group, and writing the pre-compensated storage values into the respective memory cells in the group. In an embodiment, upon selecting the second programming scheme, storing the data includes writing the storage values into the respective memory cells in the group without pre-compensation.

In some embodiments, the criterion depends on a wear level of the memory cells in the group, on a number of Programming and Erasure (P/E) cycles previously applied to the memory cells in the group, on a number of read errors occurring in one or more read operations from the memory cells in the group, on a temperature of the memory cells in the group, on a supply voltage provided to the memory cells in the group, on a retention time that is expected to occur in the memory cells in the group, and/or on a level of the interference affecting the memory cells in the group.

In an embodiment, selecting the one of the programming schemes includes selecting the second programming scheme at a first time, and switching to the first programming scheme at a second time that is later than the first time. In a disclosed embodiment, the method includes switching from the first programming scheme to the second programming scheme at a third time that is later than the second time. In an embodiment, the memory cells are included in a memory device, and selection of the one of the programming schemes is performed by a memory controller that is separate from the memory device and connected to the memory device by an interface. In another embodiment, the memory cells are included in a memory device, and selection of the one of the programming schemes is performed by programming circuitry in the memory device. In yet another embodiment, the memory cells are included in a memory device that is connected to a memory controller by an interface, and the method includes indicating the selected programming scheme over the interface.

There is additionally provided, in accordance with an embodiment of the present invention, a method for data storage, including:

defining a first programming scheme that programs a group of analog memory cells while consuming a first peak power, and a second programming scheme that programs the group of the analog memory cells while consuming a second peak power, lower than the first peak power;

selecting one of the first and second programming schemes based on a criterion defined with respect to the analog memory cells; and storing data in the group of the analog memory cells using the selected programming scheme.

In some embodiments, the first programming scheme programs the group of the memory cells at a first programming speed, and the second programming scheme programs the group of the memory cells at a second programming speed, slower than the first programming speed. In an embodiment, the criterion depends on a number of sets of the memory cells that are programmed concurrently.

There is also provided, in accordance with an embodiment of the present invention, a method for data storage, including:

defining a first programming scheme that programs a group of analog memory cells while permitting immediate aborting of programming the memory cells, and a second programming scheme that programs the group of the analog memory cells without permitting the immediate aborting;

selecting one of the first and second programming schemes based on a criterion defined with respect to the analog memory cells; and storing data in the group of the analog memory cells using the selected programming scheme.

In an embodiment, selecting the one of the programming schemes includes selecting the first programming scheme for programming the group while concurrently reading from another group of the memory cells, and selecting the second programming scheme for programming the group without concurrently reading from any other group of the memory cells.

There is further provided, in accordance with an embodiment of the present invention, apparatus for data storage, including:

a memory, including a plurality of analog memory cells; and circuitry, which is configured to define a first programming scheme that programs a group of the analog memory cells while reducing interference caused by at least one memory cell that neighbors the group, to define a second programming scheme that programs the group of the analog memory cells and does not reduce all of the interference reduced by the first programming scheme, to select one of the first and second programming schemes based on a criterion defined with respect to the analog memory cells, and to store data in the group of the analog memory cells using the selected programming scheme.

There is additionally provided, in accordance with an embodiment of the present invention, apparatus for data storage, including:

a memory, including a plurality of analog memory cells; and circuitry, which is configured to define a first programming scheme that programs a group of the analog memory cells while consuming a first peak power, to define a second programming scheme that programs the group of the analog memory cells while consuming a second peak power, lower than the first peak power, to select one of the first and second programming schemes based on a criterion defined with respect to the analog memory cells, and to store data in the group of the analog memory cells using the selected programming scheme.

There is additionally provided, in accordance with an embodiment of the present invention, apparatus for data storage, including:

a memory, including a plurality of analog memory cells; and circuitry, which is configured to define a first programming scheme that programs a group of the analog memory cells while permitting immediate aborting of programming the memory cells, to define a second programming scheme that programs the group of the analog memory cells without permitting the immediate aborting, to select one of the first and second programming schemes based on a criterion defined with respect to the analog memory cells, and to store data in the group of the analog memory cells using the selected programming scheme.

There is also provided, in accordance with an embodiment of the present invention, apparatus for data storage, including:

an interface, which is configured to communicate with a memory that includes a plurality of analog memory cells; and circuitry, which is configured to define a first programming scheme that programs a group of the analog memory cells while reducing interference caused by at least one memory cell that neighbors the group, to define a second programming scheme that programs the group of the analog memory cells and does not reduce all of the interference reduced by the first programming scheme, to select one of the first and second programming schemes based on a criterion defined with respect to the analog memory cells, and to store data in the group of the analog memory cells using the selected programming scheme.

There is further provided, in accordance with an embodiment of the present invention, apparatus for data storage, including:

an interface, which is configured to communicate with a memory that includes a plurality of analog memory cells; and circuitry, which is configured to define a first programming scheme that programs a group of the analog memory cells while consuming a first peak power, to define a second programming scheme that programs the group of the analog memory cells while consuming a second peak power, lower than the first peak power, to select one of the first and second programming schemes based on a criterion defined with respect to the analog memory cells, and to store data in the group of the analog memory cells using the selected programming scheme.

There is additionally provided, in accordance with an embodiment of the present invention, apparatus for data storage, including:

an interface, which is configured to communicate with a memory that includes a plurality of analog memory cells; and circuitry, which is configured to define a first programming scheme that programs a group of the analog memory cells while permitting immediate aborting of programming the memory cells, to define a second programming scheme that programs the group of the analog memory cells without permitting the immediate aborting, to select one of the first and second programming schemes based on a criterion defined with respect to the analog memory cells, and to store data in the group of the analog memory cells using the selected programming scheme.

The present invention will be more fully understood from the following detailed description of the embodiments thereof, taken together with the drawings in which:

DETAILED DESCRIPTION OF EMBODIMENTS

Overview

Figure 1:
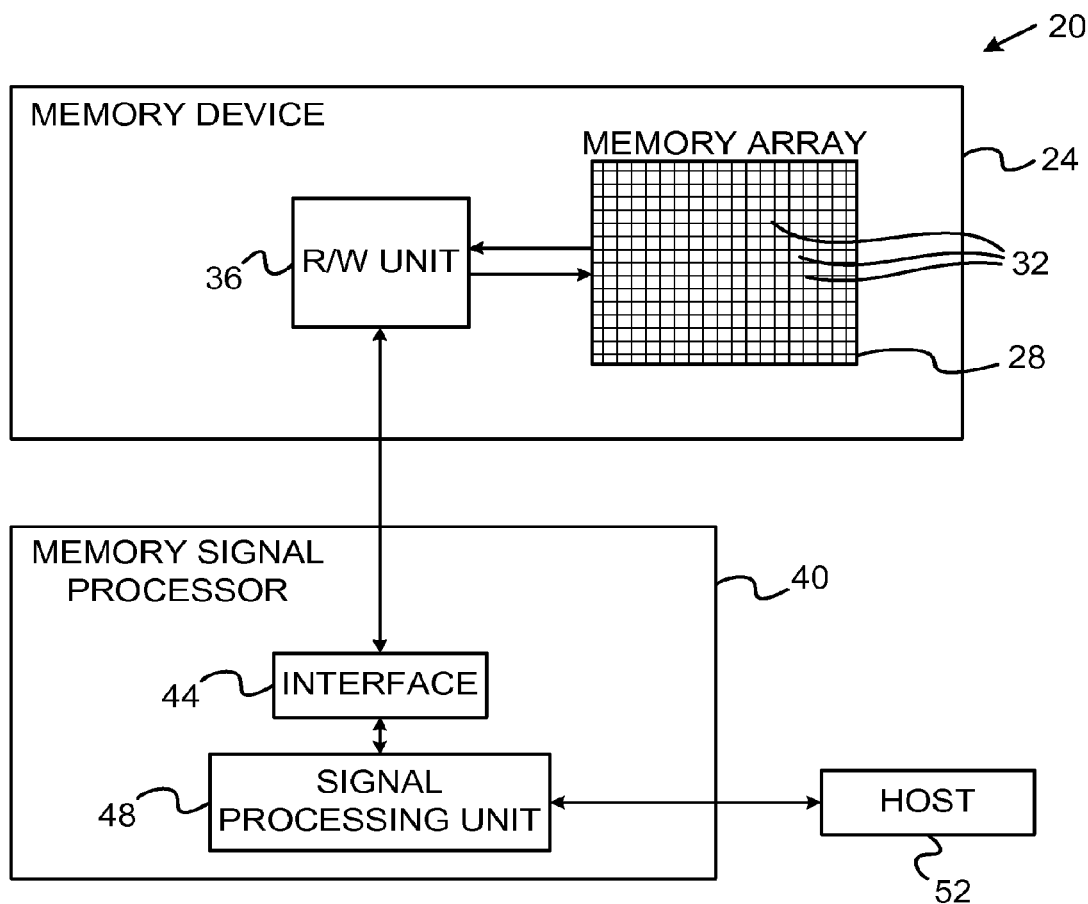
FIG. 1 is a block diagram that schematically illustrates a memory system, in accordance with an embodiment of the present invention.

Embodiments of the present invention that are described hereinbelow provide improved methods and systems for programming analog memory cells. In some embodiments, a memory system comprises a memory that includes multiple analog memory cells, and circuitry that stores data in the memory cells. The circuitry can store data in a given group of memory cells using one of two possible programming schemes. The first programming scheme stores data in the group while reducing interference from neighboring memory cells. The second programming scheme stores data in the group but does not reduce all of the interference that is reduced by the first programming scheme. On the other hand, the second programming scheme is typically faster than the first scheme. When preparing to program a given group of memory cells, the circuitry selects which of the programming schemes to use by evaluating a switching criterion defined with respect to the memory cells in the group.

Several example programming schemes and switching criteria are described herein. In some embodiments, one programming scheme applies re-programming whereas the other programming scheme does not. In the re-programming scheme, the circuitry initially programs the group of memory cells with certain data, and then, after programming at least one of the neighboring memory cells, it goes back and re-programs the group of memory cells with the same data. In alternative embodiments, one programming scheme pre-compensates the storage values written into the group of memory cells for the expected interference from neighboring memory cells. The other programming scheme does not apply pre-compensation.

Programming schemes that reduce less interference from neighboring memory cells are typically fast, but may not reach acceptable storage reliability under some circumstances. Programming schemes that reduce more interference are often slower, but on the other hand provide superior storage reliability under difficult conditions. The flexibility to choose between such programming schemes enables the system to match the programming scheme to the actual conditions of the memory cell group in question and thus to seek an optimal tradeoff between speed and reliability.

Typically, although not necessarily, the switching criterion assesses the wear level or health level of the memory cells in the group. Using this sort of criterion, fresh memory cells are programmed with little or no interference cancellation, at high speed and with little or no effect on storage reliability. Old or heavily-cycled memory cells are programmed with a scheme that cancels interference to a higher degree, so as to achieve acceptable storage reliability at the expense of reduced programming speed.

Additional examples of programming schemes that can be selected by the memory system are described herein. For example, the system can select between a programming scheme that is relatively fast but consumes a relatively high peak power, and a slower programming scheme whose peak power consumption is lower. As another example, the system can select between a programming scheme that permits immediate aborting of the programming operation, and a programming scheme that does not permit immediate aborting. Example switching criteria for these schemes are also described.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 encodes the data for storage using a suitable Error Correction Code (ECC) and decodes the ECC of data retrieved from the memory. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In some embodiments, MSP 40 (or other memory controller that carries out the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

In some embodiments, R/W unit 36 programs memory cells 32 using an iterative Program and Verify (P&V) process. In a typical P&V process, an entire group of memory cells (e.g., a memory page) is programmed by applying a sequence of programming pulses to the memory cells in the group. The storage values programmed in the cells are read ("verified") after each pulse, and the iterations continue selectively only for memory cells that have not yet reached the desired levels.

Modifying the Programming Scheme at Different Memory Cell Life-Cycle Stages

System 20 can program memory cells 32 using various programming schemes. In particular, when programming a given group of memory cells, different programming schemes may reach different levels of interference cancellation. Programming schemes that cancel more interference from neighboring memory cells are typically more accurate and provide improved resilience to interference. On the other hand, these schemes may be slower and involve more computational complexity. Programming schemes that cancel less interference may be relatively fast, but on the other hand they may be less accurate and more sensitive to interference.

In some embodiments, system 20 selects the programming scheme for programming a given group of memory cells 32 by evaluating a switching criterion that is defined with respect to the memory cells. In particular, system 20 may select between a first programming scheme that programs the memory cells while reducing interference from neighboring memory cells, and a second programming scheme that programs the memory cells but does not reduce all the interference reduced by the first programming scheme.

The term "neighboring memory cell" refers to any memory cell that potentially causes interference to one or more of the memory cells in the given group of memory cells. Typically, although not necessarily, neighboring memory cells are physically adjacent to the memory cells in the given group, e.g., in adjacent rows or columns of array 28. In some embodiments, memory cells that are physically distant from the given group of memory cells, but still cause interference to the group, may also be regarded as neighbors. On the other hand, memory cells that are programmed concurrently with the given group of memory cells (e.g., memory cells belonging to the same page, or memory cells that are programmed in the same P&V programming sequence as the given group) are not considered neighbors.

For example, system 20 may select between a programming scheme that uses re-programming and a programming scheme that does not use re-programming. A re-programming scheme initially programs certain data in a first group of memory cells, then programs a second group of neighboring memory cells that potentially cause interference to the first group, and then returns and re-programs the first group with the same data as in the initial programming. The re-programming operation ensures that each group of memory cells is programmed after the neighboring memory cells (which potentially cause interference) are already programmed. When the programming operations are performed using a closed-loop P&V process, interference from memory cells that were previously programmed is inherently compensated for. On the other hand, re-programming schemes typically reduce the programming speed, because they involve a higher number of write operations.

Note that the term "re-programming scheme" refers to a programming scheme that writes the same data to a group of memory cells (e.g., programs a given memory page) more than once. Programming schemes that store data alternately in groups of memory cells but store different data at each write operation (e.g., program different MLC bits in the same group of memory cells) are not considered re-programming schemes in the present context.

In some embodiments, system 20 defines a first programming scheme that does not use re-programming, and a second programming scheme that does apply re-programming. Initially, the system programs groups of memory cells using the first programming scheme. When a certain switching criterion with respect to the memory cells is met, the system reverts to program the memory cells using the second programming scheme.

System 20 may use various switching criteria for selecting between the two programming schemes. In some embodiments, the switching criterion assesses the wear level or health level of the memory cells in the group. For example, the criterion may specify switching from the first programming scheme to the second programming scheme when the memory cells in the group exceed a predefined number of Programming and Erasure (P/E) cycles. In other words, the system will program the memory cells without re-programming below a certain number of P/E cycles, and revert to applying re-programming when the predefined number of P/E cycles is exceeded.

As another example, the switching criterion may consider the number of read errors that were encountered in reading the group of memory cells in the last read operation, or in the last several read operations. Below a certain number of read errors, the system may continue to program the memory cells without re-programming. When the number of read errors exceeds a certain value, the system begins to apply re-programming in subsequent programming operations.

When using the example switching criteria described above, the system selects a programming scheme that matches the actual wear level or health level of the memory cells. When the memory cells are relatively fresh and healthy, they can be programmed at high speed with little or no interference cancellation, and with little or no effect on storage reliability. At a later stage in the cells' life cycle, re-programming (or other interference cancellation scheme) may be needed to achieve reliable storage.

Typically, although not necessarily, the system uses the faster programming scheme in the early life cycle stages of the memory cells, and switches to the slower but more robust programming scheme later in the memory cells' life cycle. Alternatively, however, any other suitable switching criterion can also be used. For example, the switching criterion may depend on the level of distortion (e.g., cross-coupling interference from neighboring memory cells) that affects the group of memory cells. When the distortion level is low, the system may program the memory cells without re-programming. When the distortion is high, the system may begin to apply re-programming in order to improve the programming accuracy and reduce the distortion.

As another example, switching between programming schemes can be performed as a function of the memory device temperature. Another example switching criterion depends on the supply voltage (Vcc) that provides electrical power to the group of memory cells. For example, a NAND Flash device may operate with a supply voltage around 3.3V or around 1.8V. In some embodiments, the system may select a given programming scheme when the supply voltage is around 3.3V, and another programming scheme when the supply voltage is around 1.8V.

As yet another example, the switching criterion may depend on the expected retention time of the cell group in question, i.e., on the time period that is expected to elapse from programming until the memory cells are read or refreshed. When the expected retention time is relatively short, the system may use a programming scheme that does not apply re-programming. When the expected retention time is long or unknown, the system may choose to apply re-programming in order to maintain storage reliably during the retention period. In an example embodiment, system 20 is used in a computer that supports a hibernation state, e.g., in a SSD. When the computer is preparing to enter the hibernation state, it stores various kinds of data in a hibernation file that is used for restoring the computer state and applications when resuming operation. In most practical cases, the hibernation period does not exceed a certain known length, e.g., one month. Therefore, system 20 may store the hibernation file using a relatively fast programming scheme without re-programming. Other data can be stored with re-programming.

In some of the above-mentioned examples, as well as in other possible switching criteria, the system may alternate between the two programming schemes more than once, as appropriate. In some embodiments, the switching condition also depends on the identity of the group of memory cells or its location in the memory. For example, a switching criterion may specify the following: When the number of P/E cycles exceeds 1000, switch to the second programming scheme only for word lines 1-10; when the number of P/E cycles exceeds 2000, switch to the second programming scheme for word lines 1-30; and when the number of P/E cycles exceeds 3000, switch to the second programming scheme only for all word lines. Any other suitable switching criterion that depends on the identity or location of the cell group in the memory can also be used.

In alternative embodiments, system 20 defines a first programming scheme that pre-compensates for the expected interference from the neighboring memory cells, and a second programming scheme that does not perform pre-compensation. The system then selects between the two programming schemes using a certain switching criterion. Any of the switching criteria described above, or any other suitable switching criterion, can be used for this purpose.

When preparing to program a given group of memory cells, system 20 may pre-compensate for the expected interference in various ways. For example, the system may read the data or storage values from the neighboring memory cells and calculate corrections that, if applied to the storage values written into the memory cells in the group will cancel the expected interference. The system can then apply the corrections, and write the pre-corrected storage values into the memory cells in the group. In alternative embodiments, the system may estimate the expected interference without reading the neighboring memory cells. For example, when the data that was written into the neighboring cells is still cached in the MSP or in the memory device, the system may calculate the corrections based on the cached data.

In some embodiments, system 20 may combine the two above-mentioned techniques, i.e., define a first programming scheme that uses re-programming and pre-compensation, and a second programming scheme that does not use re-programming or pre-compensation. Additionally or alternatively, the system may define and select between any other suitable programming schemes. In some embodiments, the system may switch among more than two programming schemes using suitable switching criteria. For example, one programming scheme may apply no re-programming and no interference pre-compensation, a second programming scheme may apply re-programming but no interference pre-compensation, and a third programming scheme may apply both re-programming and interference pre-compensation.

Figure 2:
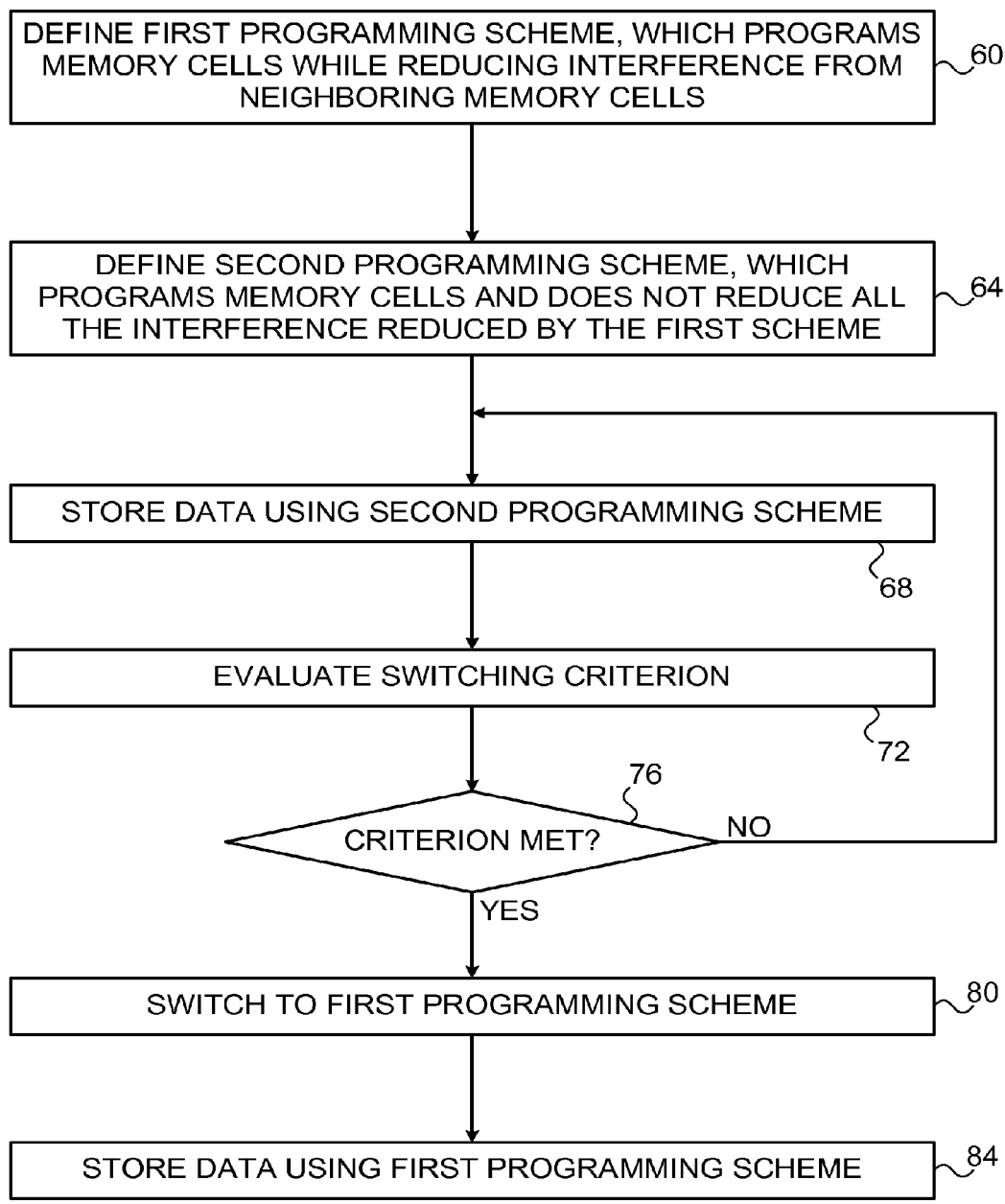
FIG. 2 is a flow chart that schematically illustrates a method for programming analog memory cells, in accordance with an embodiment of the present invention.

FIG. 2 is a flow chart that schematically illustrates a method for programming analog memory cells, in accordance with an embodiment of the present invention. The method begins with system 20 defining a first programming scheme that programs a group of memory cells while reducing interference from at least one neighboring memory cells, at a first definition step 60. The system further defines a second programming scheme, which programs the group of memory cells but does not cancel all the interference that is canceled by the first scheme, at a second definition step 64.

For a given group of memory cells, system 20 initially stores data received from host 52 using the second programming scheme, at an initial storage step 68. The system evaluates a predefined switching criterion, at a criterion evaluation step 72. If the switching criterion is not met, as checked at a checking step 76, the method loops back to step 68 above. Otherwise, i.e., if the switching criterion is met, system 20 switches to the first programming scheme, at a switching step 80. The system continues to store data in the given group of memory cells using the first programming scheme, at a subsequent storage step 84.

In some embodiments, evaluation of the switching criterion and selection of the appropriate programming scheme are carried out by MSP 48, e.g., by unit 48. In alternative embodiments, switching criterion evaluation and programming scheme selection are carried out by R/W unit 36 in memory device 24. Further alternatively, these functions can be partitioned between the MSP and the memory device in any desired fashion. In an example embodiment, MSP 40 selects the appropriate programming scheme, and notifies R/W unit 36 of the selected scheme. The R/W unit applies the selected programming scheme in response to the notification from the MSP. In another embodiment, the R/W unit selects the programming scheme and reports the selected scheme to the MSP. The MSP and memory device may support a suitable command or signal interface for exchanging these notifications. In the present context, MSP 40 and R/W unit 36 are regarded as circuitry, which evaluates the switching criterion and selects the programming scheme accordingly.

Evaluation of the switching condition and selection of the programming scheme can be performed for different groups of memory cells, e.g., per page or set of pages, per sector or set of sectors, per word line or set of word lines, per erasure block or set of blocks, per memory plane, per memory device in a multi-device system, per semiconductor die in a multi-die device, or at any other suitable granularity.

Additional Example Programming Schemes

In alternative embodiments, system 20 may define and select between other kinds of programming schemes using suitable switching criteria. For example, in some practical cases the peak power consumed by system 20 is limited. In some embodiments, system 20 defines one programming scheme that is relatively fast but consumes a relatively high peak power, and another programming scheme that is slower but has lower peak power consumption. For example, one programming scheme may program all the memory cells in a given word line concurrently using a P&V process. The other programming scheme may divide the cells of the word line into subsets, and program one subset at a time using P&V. Programming one subset at a time reduces the peak power consumption of the programming operation, at the expense of reducing the programming speed. Alternatively, any other suitable programming scheme having lower peak power consumption can be used.

System 20 may select between the two programming schemes using various switching criteria. For example, the switching criterion may depend on the number of sets of memory cells (e.g., number of dies or memory planes) that are programmed concurrently. In an example embodiment, when the programming operation programs multiple sets of memory cells concurrently (e.g., a command that programs multiple dies simultaneously), the peak power is expected to be high. In these scenarios, the system may select a slower programming scheme that draws less peak power. When programming a single set of memory cells (e.g., a single die), or a small number of sets, the faster and higher-power programming scheme may still meet the peak power limit of the system.

As another example, system 20 may define one programming scheme that permits immediate aborting before completion of the programming operation, and another programming scheme that does not permit premature aborting of the programming. When defining a P&V operation, immediate aborting can be enabled, for example, by having the memory device check after each P&V iteration whether an abort instruction was given by the MSP. Typically, a programming scheme that permits immediate aborting is slower, but may be preferable under certain circumstances. For example, when the programming operation is carried out in parallel to reading from another group of memory cells (e.g., during copyback or read-while-write operations), it may be preferable for the MSP to abort the programming operation in order to enable readout.

In the description above, some switching criteria were described in the context of specific programming schemes. This choice, however, was made purely for the sake of conceptual clarity. Generally, any of the switching criteria defined herein can be used to select between any of the disclosed programming schemes.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:
1. A method for data storage, comprising:
  defining a first programming scheme that programs a group of analog memory cells while consuming a first peak power, and a second programming scheme that programs the group of the analog memory cells while consuming a second peak power, lower than the first peak power;

selecting one of the first and second programming schemes based on a criterion defined with respect to the analog memory cells; and storing data in the group of the analog memory cells using the selected programming scheme.

2. The method according to claim 1, wherein the first programming scheme programs the group of the memory cells at a first programming speed, and wherein the second programming scheme programs the group of the memory cells at a second programming speed, slower than the first programming speed.

3. The method according to claim 1, wherein the criterion depends on a number of sets of the memory cells that are programmed concurrently.

4. Apparatus for data storage, comprising:

a memory, comprising a plurality of analog memory cells; and circuitry, which is configured to define a first programming scheme that programs a group of the analog memory cells while consuming a first peak power, to define a second programming scheme that programs the group of the analog memory cells while consuming a second peak power, lower than the first peak power, to select one of the first and second programming schemes based on a criterion defined with respect to the analog memory cells, and to store data in the group of the analog memory cells using the selected programming scheme.

5. The apparatus according to claim 4, wherein the first programming scheme programs the group of the memory cells at a first programming speed, and wherein the second programming scheme programs the group of the memory cells at a second programming speed, slower than the first programming speed.

6. The apparatus according to claim 4, wherein the criterion depends on a number of sets of the memory cells that are programmed concurrently.

7. Apparatus for data storage, comprising:

an interface, which is configured to communicate with a memory that includes a plurality of analog memory cells; and circuitry, which is configured to define a first programming scheme that programs a group of the analog memory cells while consuming a first peak power, to define a second programming scheme that programs the group of the analog memory cells while consuming a second peak power, lower than the first peak power, to select one of the first and second programming schemes based on a criterion defined with respect to the analog memory cells, and to store data in the group of the analog memory cells using the selected programming scheme.

8. The method according to claim 1, wherein the criterion depends on a wear level of the memory cells in the group.

9. The method according to claim 1, wherein the criterion depends on a number of Programming and Erasure (P/E) cycles previously applied to the memory cells in the group.

10. The method according to claim 1, wherein the criterion depends on a number of read errors occurring in one or more read operations from the memory cells in the group.

11. The method according to claim 1, wherein the criterion depends on a temperature of the memory cells in the group.

12. The method according to claim 1, wherein the criterion depends on a supply voltage provided to the memory cells in the group.

13. The method according to claim 1, wherein the criterion depends on a retention time that is expected to occur in the memory cells in the group.

14. The method according to claim 1, wherein the criterion depends on a level of the interference affecting the memory cells in the group.

15. The method according to claim 1, wherein selecting the one of the programming schemes comprises selecting the second programming scheme at a first time, and switching to the first programming scheme at a second time that is later than the first time.

16. The method according to claim 15, and comprising switching from the first programming scheme to the second programming scheme at a third time that is later than the second time.

17. The method according to claim 1, wherein the memory cells are comprised in a memory device, and wherein selection of the one of the programming schemes is performed by a memory controller that is separate from the memory device and connected to the memory device by an interface.

18. The method according to claim 1, wherein the memory cells are comprised in a memory device, and wherein selection of the one of the programming schemes is performed by programming circuitry in the memory device.

19. The method according to claim 1, wherein the memory cells are comprised in a memory device that is connected to a memory controller by an interface, and comprising indicating the selected programming scheme over the interface.

20. The apparatus according to claim 4, wherein the criterion depends on a wear level of the memory cells in the group.

21. The apparatus according to claim 4, wherein the criterion depends on a number of Programming and Erasure (P/E) cycles previously applied to the memory cells in the group.

22. The apparatus according to claim 4, wherein the criterion depends on a number of read errors occurring in one or more read operations from the memory cells in the group.

23. The apparatus according to claim 4, wherein the criterion depends on a temperature of the memory cells in the group.

24. The apparatus according to claim 4, wherein the criterion depends on a supply voltage provided to the memory cells in the group.

25. The apparatus according to claim 4, wherein the criterion depends on a retention time that is expected to occur in the memory cells in the group.

26. The apparatus according to claim 4, wherein the criterion depends on a level of the interference affecting the memory cells in the group.

27. The apparatus according to claim 4, wherein the circuitry is configured to select the second programming scheme at a first time, and to switch to the first programming scheme at a second time that is later than the first time.

28. The apparatus according to claim 27, wherein the circuitry is configured to switch from the first programming scheme to the second programming scheme at a third time that is later than the second time.

29. The apparatus according to claim 4, wherein the circuitry comprises programming circuitry that is coupled to the memory cells and a memory controller that is separate from the programming circuitry and connected to the programming circuitry by an interface, and wherein selection of the one of the programming schemes is performed by the memory controller.

30. The apparatus according to claim 4, wherein the circuitry comprises programming circuitry that is coupled to the memory cells and a memory controller that is separate from the programming circuitry and connected to the programming circuitry by an interface, and wherein selection of the one of the programming schemes is performed by the programming circuitry.

31. The apparatus according to claim 4, wherein the circuitry comprises programming circuitry that is coupled to the memory cells and a memory controller that is separate from the programming circuitry and connected to the programming circuitry by an interface, and comprising indicating the selected programming scheme over the interface.

* * * * *